US008513880B2

(12) United States Patent
Suzuki et al.

(10) Patent No.: US 8,513,880 B2
(45) Date of Patent: Aug. 20, 2013

(54) DISPLAY APPARATUS

(75) Inventors: Takahito Suzuki, Tokyo (JP); Tomoki Igari, Tokyo (JP)

(73) Assignee: Oki Data Corporation, Tokyo (JP)

( * ) Notice: Subject to any disclaimer, the term of this patent is extended or adjusted under 35 U.S.C. 154(b) by 601 days.

(21) Appl. No.: 12/709,549

(22) Filed: Feb. 22, 2010

(65) Prior Publication Data

US 2010/0214200 A1 Aug. 26, 2010

(30) Foreign Application Priority Data

Feb. 24, 2009 (JP) ................................ 2009-040422

(51) Int. Cl.
*H01J 1/62* (2006.01)

(52) U.S. Cl.
USPC .......................................... 313/505; 313/498

(58) Field of Classification Search
USPC .......................................... 313/498, 500, 505
See application file for complete search history.

(56) References Cited

U.S. PATENT DOCUMENTS

| 4,241,281 | A | * | 12/1980 | Morimoto et al. | 315/161 |
| 5,834,893 | A | * | 11/1998 | Bulovic et al. | 313/506 |
| 2004/0124763 | A1 | * | 7/2004 | Nathan et al. | 313/498 |
| 2006/0250085 | A1 | * | 11/2006 | Doi et al. | 313/512 |
| 2007/0132369 | A1 | * | 6/2007 | Forrest et al. | 313/503 |

FOREIGN PATENT DOCUMENTS

JP 2002-261335 A 9/2002

* cited by examiner

*Primary Examiner* — Anh Mai
*Assistant Examiner* — Andrew Coughlin
(74) *Attorney, Agent, or Firm* — Marvin A. Motsenbocker; Mots Law, PLLC (57) ABSTRACT

A high-definition, high-intensity display apparatus having a plurality of semiconductor thin film light emitting elements and a plurality of linear electrodes connecting a power source to the light emitting elements, the linear electrodes being disposed so as to minimize the voltage drop across the linear electrodes.

17 Claims, 6 Drawing Sheets

DISPLAY APPARATUS

CROSS REFERENCE TO RELATED APPLICATIONS

This application claims priority based on 35 USC 119 from prior Japanese Patent Application No. P2009-040422 filed on Feb. 24, 2009, entitled "DISPLAY APPARATUS", the entire content of which is incorporated herein by reference.

BACKGROUND OF THE INVENTION

1. Field of the Invention

The invention relates to a display apparatus including a matrix of semiconductor thin film light emitting elements integrated on a substrate.

2. Description of Related Art

Conventionally, in high-definition LED display apparatus using light emitting diodes (hereinafter, referred to as "LED"), that have very small pixel pitch of 3 mm or less bare chip LEDs are mounted in a two dimensional array (for example, Japanese Patent Application Laid-Open No. 2002-261335).

Specifically, a matrix of anode common lines and cathode common lines is formed on a substrate. Bare chip LED mounting areas are provided in areas other than the anode common lines and the cathode common lines. In order to electrically connect the bare chip LEDs, an anode electrode pad and a cathode electrode pad are formed extending from each anode common line and each cathode common line to the bare chip LED mounting areas. These electrode pads formed on the substrate are connected to an anode electrode pad and a cathode electrode pad formed on the bare chip LEDs. To connect the electrode pads on the substrate to the electrode pads on the bare chip LED, a gold (Au) bonding wire is applied to connect the electrode pads on the substrate to the electrode pads on the bare chip LED, or the bare chip LED is disposed on the substrate such that the surface having the electrode pads face the substrate and a conductive material connects the electrode pad on the bare chip LED and the electrode pads on the substrate.

SUMMARY OF THE INVENTION

However, in such a conventional display apparatus, since the bare chip LED mounting areas are provided in areas other than the anode common lines and the cathode common lines, the wire line width is limited by the bare chip LED mounting areas so that the width of the anode common lines and the cathode common lines cannot be widened to reduce the wiring resistance. To achieve reduction of the wire resistance, the area for light emission becomes extremely small.

On the other hand, if the bare chip LED mounting area is enlarged, the width of the anode common lines and the cathode common lines must be decreased thereby resulting in a higher voltage drop across the wires and uneven brightness over the entire display.

Further, if increasing the density of bare chip LEDs is desired, the bare chip LED mounting area must be increased making it difficult to maintain the area for the anode common lines and the cathode common lines, thereby requiring the wire width to decrease.

Therefore, with such a conventional display apparatus, it has been extremely difficult to realize greater density of light emitting elements and a smaller voltage drop across the connecting wires.

A first aspect of the invention is a display apparatus including: a plurality of parallel electrically conducting first linear electrodes extending on a planer substrate in a first direction; a plurality of parallel electrically conducting second linear electrodes extending in a second direction orthogonal to the first direction and spaced from the first linear electrodes in a third direction orthogonal to the plane of the substrate; a planarizing insulating film provided on the second linear electrodes at the intersections of the first and second linear electrodes to planarize the upper surfaces of the second linear electrodes; a plurality of semiconductor thin film light emitting elements, each one having an upper surface and a lower surface, the upper surface having a first conductive electrode and a second conductive electrode, the first and second electrodes are exposed from the upper surface, and the lower surface being connected to the planarizing insulating film; a first connection wire electrically connecting the first linear electrodes and the second conductive electrodes; and a second connection wire electrically connecting the second linear electrodes and the first conductive electrodes.

A second aspect of the invention is a display apparatus including: a plurality of parallel electrically conducting first linear electrodes extending on a planer substrate in a first direction; a plurality of parallel electrically conductive second electrodes extending in a second direction orthogonal to the first direction and spaced from the first linear electrodes in a third direction orthogonal to the plane of the substrate; a planarizing insulating film configured to block light, the planarizing insulating film provided on and planarizing the entire upper surface of the substrate including the intersections of the first and second linear electrodes and areas other than the intersections; a plurality of semiconductor thin film light emitting elements, each one having an upper surface and a lower surface, the upper surface having a first conductive electrode and a second conductive electrode, the first and second electrodes are exposed from the upper surface, and the lower surface being connected to the planarizing insulating film; a first connection wire electrically connecting the first linear electrodes the second conductive electrodes; and a second connection wire electrically connecting the second linear electrodes and the first conductive electrodes.

The display apparatus of the first aspect of the invention has a maximum area for forming the linear electrodes maintaining a high occupancy ratio of the light emitting area. Thus, a high-definition, high-intensity and large-screen display apparatus including semiconductor thin film light emitting elements is achieved.

In the display apparatus of the second aspect of the invention, since almost all areas around the semiconductor thin film light emitting elements is covered by a light-block planarizing insulating film, a high-contrast display apparatus is achieved.

DETAILED DESCRIPTION OF EMBODIMENTS

Next, embodiments of the invention will be described with reference to the drawings. In the respective drawings referenced herein, the same constituents are designated by the same reference numerals and duplicate explanation concerning the same constituents is omitted. All of the drawings are provided to illustrate the respective examples only. No dimensional proportions in the drawings shall impose a restriction on the embodiments. For this reason, specific dimensions and the like should be interpreted with the following descriptions taken into consideration. In addition, the drawings may include parts whose dimensional relationship and ratios are different from one drawing to another.

[First Embodiment]
(Configuration of First Embodiment)

Figure 1:
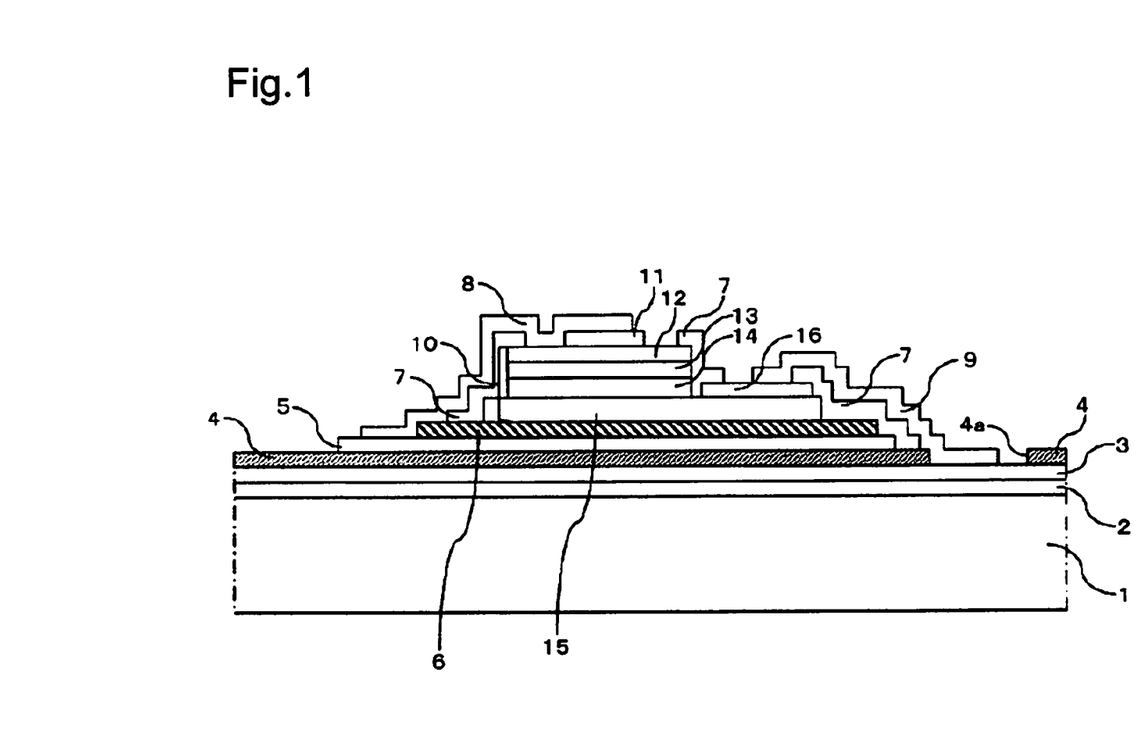
FIG. 1 is a sectional view of a pixel of a display apparatus according to the first embodiment of the invention.
Figure 2:
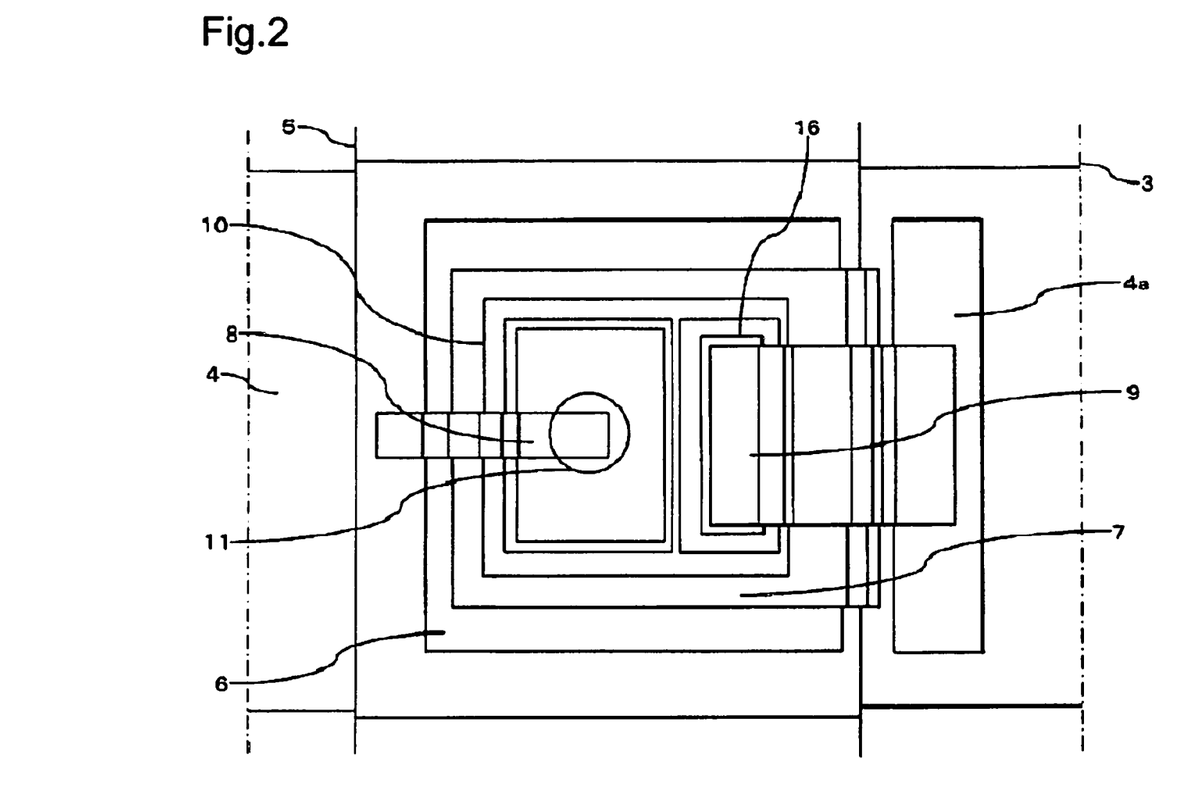
FIG. 2 is a plan view of the surface configuration of the pixel of FIG. 1.

FIG. 1 is a sectional view of a pixel of a display apparatus according to a first embodiment of the invention. FIG. 2 is a plan view of a surface configuration of the pixel of FIG. 1.

As shown in FIGS. 1 and 2, the display apparatus of the first embodiment has substrate 1. Parallel conducting linear electrodes, hereafter referred to as lower electrode common lines 3, extending in a first direction, hereafter referred to as the row direction, are formed on interlayer insulation film 2, which was previously formed on substrate 1. Substrate 1 is, for example, a metal substrate made of iron (Fe), copper (Cu), stainless steel (SUS), aluminum (Al), or the like, a semiconductor substrate made of silicon (Si), or the like, or an insulating substrate made of glass, plastic, or the like. Note that, in the case where substrate 1 is an insulator, lower electrode common lines 3 may be formed directly on the insulating substrate without interlayer insulation film 2. Interlayer insulation film 2 is, for example, an inorganic insulating film made of silicon nitride (SiN), silicon oxide ($SiO_2$), aluminum oxide ($Al_2O_3$) or the like, or an organic insulation film made of polyimide, acrylic, novolac permanent film or the like. Lower electrode common lines 3 are made of, for example, Au, Al, titanium (Ti), platinum (Pt) or the like. Interlayer insulation film 4 is formed on the whole surface including lower electrode common lines 3.Interlayer insulation film 4 is made of, for example, the same material as interlayer insulation film 2. At predetermined positions of interlayer insulation film 4, contact holes 4a (see FIG. 3) are opened to expose portions of respective lower electrode common lines 3. Parallel conducting linear electrodes, hereafter referred to as upper electrode common lines 5 that extend in a second direction, hereafter referred to as the column direction, orthogonal to lower electrode common lines 3 are formed on interlayer insulation film 4. Upper electrode common lines 5 are made of, for example, the same material as lower electrode common lines 3.

At the intersections of lower electrode common lines 3 and upper electrode common lines 5, planarizing insulating films 6, for planarizing the surface of upper electrode common lines 5, are formed on upper electrode common lines 5. On each planarizing insulating film 6, the lower surface of each of semiconductor thin film light emitting elements (for example, semiconductor thin film LED) 10 is joined using an intermolecular force. Planarizing insulating film 6 is, for example, an inorganic insulating film made of SiN, $SiO_2$, $Al_2O_3$ or the like, an organic insulation film made of polyimide, acrylic, novolac permanent film or the like and its typical surface roughness is preferably less than 5 nm. Further, planarizing insulating film 6 is preferably made of a material that transmits light emission wavelength emitted from semiconductor thin film LED 10 joined thereon.

Semiconductor thin film LED 10 has first conductive electrode (for example, an upper contact layer serving as an anode electrode) 11 whose upper surface is exposed and upper cladding layer 12 formed below upper contact layer 11. Below upper cladding layer 12, lower contact layer 15 is formed, such that active layer 13 and lower cladding layer 14 are provided between upper cladding layer 12 and lower contact layer 15. Second conductive electrode (for example, a lower electrode serving as a cathode electrode) 16 whose upper surface is exposed is formed on lower contact layer 15.

Semiconductor thin film LED 10 is, for example, composed of compound semiconductor layers of InP, $In_xGa_{1-x}P$, GaAs, $Al_xGa_{1-x}As$, GaP, $(Al_xGa_{1-x})_yIn_{1-y}P$, $Al_xIn_{1-x}P$, GaN, $In_xGa_{1-x}N$, $Al_xGa_{1-x}N$ and AlN, and the thickness of the film is less than 5 μm for example. Regardless of the mounting area of such LED semiconductor thin films 10, the width of upper electrode common lines 5 and lower electrode common lines 3 can be increased to an extent until just before interfering with neighboring lines.

The upper face and side faces of each semiconductor thin film LED 10 are covered with interlayer insulation film 7. Each interlayer insulation film 7 is made of the same material as other interlayer insulation films 2 and 4. Interlayer insulation film 7 has openings at portions corresponding to the upper surface of semiconductor thin film LED 10 so that entire upper contact layer 11, a portion of upper cladding layer 12, and a portion of lower electrode 16 are exposed. On interlayer insulation film 7, second connection wire (hereafter referred to as upper electrode connection wire) 8 and first connection wire (hereafter referred to as lower electrode connection wire) 9 are formed for each LED 10. Each upper electrode connection wire 8 electrically connects upper contact layer 11 and the portion of upper electrode common line 5 that is exposed from planarizing insulating film 6. Further, each lower electrode connection wire 9 electrically connects lower electrode 16 and the portion of lower electrode common line 3 that is exposed through contact hole 4a.

Semiconductor thin film LED 10 is protected by interlayer insulation film 7 formed between upper electrode connection wire 8 and semiconductor thin film LED 10 and between lower electrode connection wire 9 and semiconductor thin film LED 10. Further, the insulation of semiconductor thin film LED 10 from upper electrode connection wire 8 and lower electrode connection wiring 9 is maintained except for the contacting areas.

Figure 3:
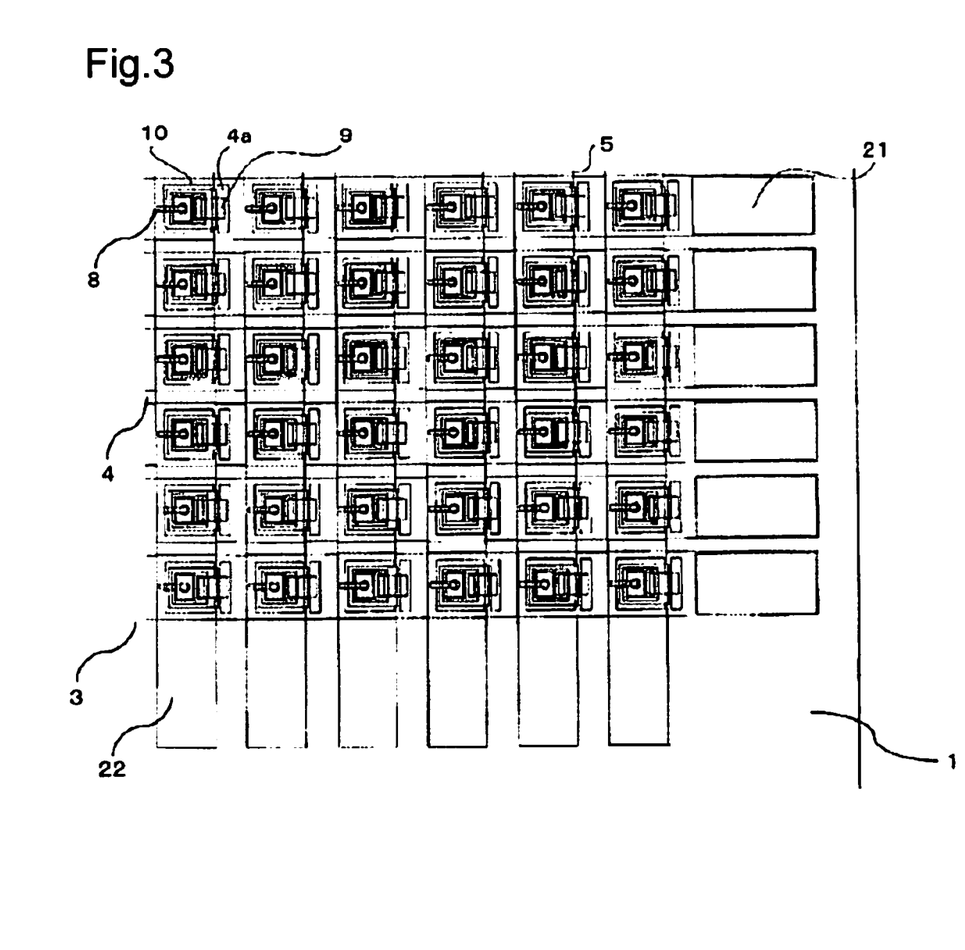
FIG. 3 is a plan view of the entire display apparatus according to the first embodiment of the invention.

FIG. 3 is a plan view of the entire display apparatus according to the first embodiment.

Lower electrode common lines 3 and upper electrode common lines 5 are arranged in the row and column directions respectively to form a matrix of wires and are insulated from each other by interlayer insulation film 4. The matrix wiring is formed on interlayer insulation film 2 on substrate 1. In the outer portion of the display apparatus, contact pads 21 for lower electrode common lines and contact pads 22 for upper electrode common lines are provided to electrically connect lower and upper electrode common lines 3 and 5 to an external driving circuit (not shown). On contact pads 21 and 22, neither interlayer insulation film 4 nor planarizing insulating film 6 is formed so that contact pads 21 and 22 are exposed on the upper surface of substrate 1.

(Manufacture of First Embodiment)

Interlayer insulation film 2, such as an inorganic insulating film or an organic insulation film, is formed on the entire surface of substrate (for example, a metal substrate, a semiconductor substrate or an insulating substrate) 1 by chemical vapor deposition (hereinafter, referred to as "CVD method") or the like. A wire material made of Au, Al, Ti, Pt or the like is formed on the entire surface of interlayer insulation film 2 by a vapor deposition method, a sputtering method or the like. The wire material is patterned to form lower electrode common lines 3 that are arranged parallel to each other and extend in the row direction by a photolithography technology. At one end of each lower electrode common line 3, contact pad 21 is formed. Note that when an insulating substrate is used as substrate 1, interlayer insulation film 2 may be omitted.

Interlayer insulation film 4 made of an inorganic insulating film, an organic insulation film or the like is formed on the entire surface including lower electrode common lines 3 (but not on contact pads 21) by a CVD method or the like. Contact hole 4a is formed at a portion of interlayer insulation film 4 to expose a portion of lower electrode common lines 3 by a photolithography technology. Wire material made of Au, Al, Ti, Pt or the like is formed on the entire surface of interlayer insulation film 4 by a vapor deposition method, sputtering method or the like. the wire material is patterned and forms upper electrode common lines 5 extending in the column direction by a photolithography technology. At one end of each upper electrode common line 5, contact pad 22 is formed.

Planarizing insulating film 6 such as an inorganic insulating film and an organic insulation film that transmits (for example, transparent for) the light emission wavelength emitted from the semiconductor thin film LED is formed on the entire surface including upper electrode common lines 5 by a CVD method or the like. Next, portions of planarizing insulating film 6 that are on areas other than the intersections of lower electrode common lines 3 and upper electrode common lines 5 are removed by a photolithography technology or the like. With this, portions of planarizing insulating film 6 that are on the intersections of lower electrode common lines 3 and upper electrode common lines 5 are left. The typical surface roughness of planarizing insulating film 6 is preferably equal to or less than 5 nm. Lower contact layer 15 comprising the lower surface of each semiconductor thin film LED 10 is joined on planarizing insulating film 6 at each intersection of lower electrode common lines 3 and upper electrode common lines 5 by using an intermolecular force. Note that semiconductor thin film LED 10, which comprises upper contact layer 11, upper cladding layer 12, active layer 13, lower cladding layer 14, lower contact layer 15, and lower electrode 16, is previously manufactured before the above joint process.

Semiconductor thin film LED 10 is composed of, for example, a compound semiconductor layer of InP, InxGa1-xP, GaAs, AlxGa1-xAs, GaP, (AlxGa1-x) yIn1-yP, AlxIn1-xP, GaN, InxGa1-xN, AlxGa1-xN and AlN, and the thickness of the entire film is equal to or less than 5 μm for example. The compound semiconductor layer can be created on a substrate by a metal-organic chemical vapor deposition method (MOCVD method), a metal-organic vapour phase epitaxy method (MOVPE method), a molecular beam epitaxy method (MBE method) or the like. Semiconductor thin film LED 10 made of such compound semiconductor layer is separated from the substrate by a chemical lift-off method, a laser lift method, grinding or the like, and then joined to planarizing insulating film 6.

After semiconductor thin film LEDs 10 are joined, interlayer insulation film 7 such as an inorganic insulating film, an organic insulation film or the like is formed on the entire surface of semiconductor thin film LED 10 by a CVD method or the like. Interlayer insulation film 7 is patterned by a photolithography technology or the like. In the patterning, portions of interlayer insulation film 7 not on the upper surface of semiconductor thin film LED 10 and a portion of interlayer insulation film 7 at the side of the semiconductor thin film LED 10 are removed. Further, lower interlayer insulation film 4 is also patterned and thereby contact holes 4a for the lower electrode common line are opened.

The wire material such as Au, Al, Ti, Pt or the like is formed on the entire surface by a vapor deposition method, a sputtering method or the like, and the wiring material is patterned by a photolithography technology or the like to form upper electrode connection wires 8 and lower electrode connection wires 9. In this configuration, upper electrode connection wires 8 electrically connect upper contact layer 11 to an area of upper electrode common line 5 that is exposed from planarizing insulating film 6 and, lower electrode connection wires 9 electrically connect lower electrode 16 to an area of lower electrode common line 3 that is exposed through contact hole 4a. Forming an un-illustrated protective film or the like finishes the process of manufacturing the display apparatus shown FIG. 3.

(Operation of First Embodiment)

To drive the display apparatus shown in FIG. 3 drive current is selectively supplied to contact pads 21 for the lower electrode common lines and to contact pads 22 for the upper electrode common lines from an external driving circuit (not shown). The drive current supplied to contact pads 21 and 22 is sent to upper electrode connection wire 8 and lower electrode connection wire 9 shown in FIGS. 1 and 2 via lower electrode common lines 3 and upper electrode common lines 5.

The drive current sent to upper electrode connection wire 8 and lower electrode connection wire 9 is supplied to upper contact layer 11 and lower electrode 16 of semiconductor thin film LED 10 thereby causing active layer 13 in semiconductor thin film LED 10 to emit light upward and downward. The light emitted upward penetrates through upper cladding layer 12 and is radiated upwardly from LED 10. The light emitted downward penetrates lower cladding layer 14, lower contact layer 15 and planarizing insulating film 6 and is reflected by upper electrode common line 5. The reflected light penetrates through planarizing insulating film 6, lower contact layer 15, lower cladding layer 14, active layer 13 and upper cladding layer 12 and is radiated upwardly from LED 10. With this configuration, a high-intensity display can be obtained.

(Effect of First Embodiment)

The typical surface roughness of a thin film wire formed by a vapor deposition method, a sputtering method or the like is generally greater than 5 nm, so it is difficult to mount semiconductor thin film LEDs 10 directly onto the intersection of lower electrode common line 3 and upper electrode common line 5 by using an intermolecular force. In the first embodiment, planarizing insulating film 6, whose surface has a typical roughness equal or less than 5 nm, is formed on the intersection of lower electrode common line 3 and upper electrode common line 5 to planarize the intersection, and semiconductor thin film LED 10 is three-dimensionally mounted on planarizing insulating film 6 by using an intermolecular force. With this configuration, the following effects (a) to (c) can be obtained.

(a) The width of each lower electrode common line 3 and upper electrode common line 5 can be increased regardless of the size of the area for mounting semiconductor thin film LEDs 10.

(b) Planarizing insulating film 6 is made of a material that transmit (for example, being transparent for) the light emission wavelength emitted from semiconductor thin film LED 10 mounted on planarizing insulating film 6.

Upper electrode common line 5 formed immediately under planarizing insulating film 6 thus functions as a reflection metal.

(c) According to effects (a) to (b), while maintaining a high occupancy ratio of LED light emitting areas, areas for forming lower electrode common lines 3 and upper electrode common lines 5 are kept maximum so that the wiring resistance can be reduced. Accordingly, a high-definition, high-intensity and large-screen display apparatus can be created.

[Second Embodiment]

(Configuration of Second Embodiment)

Figure 4:
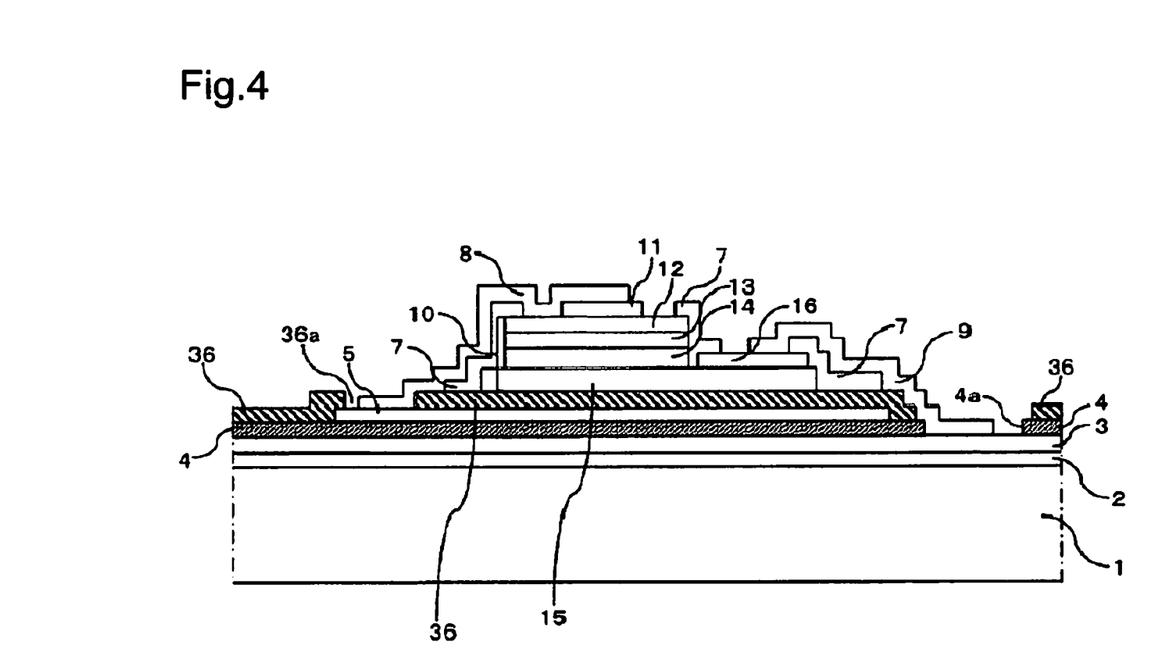
FIG. 4 is a sectional view of a pixel of a display apparatus according to the second embodiment of the invention.
Figure 5:
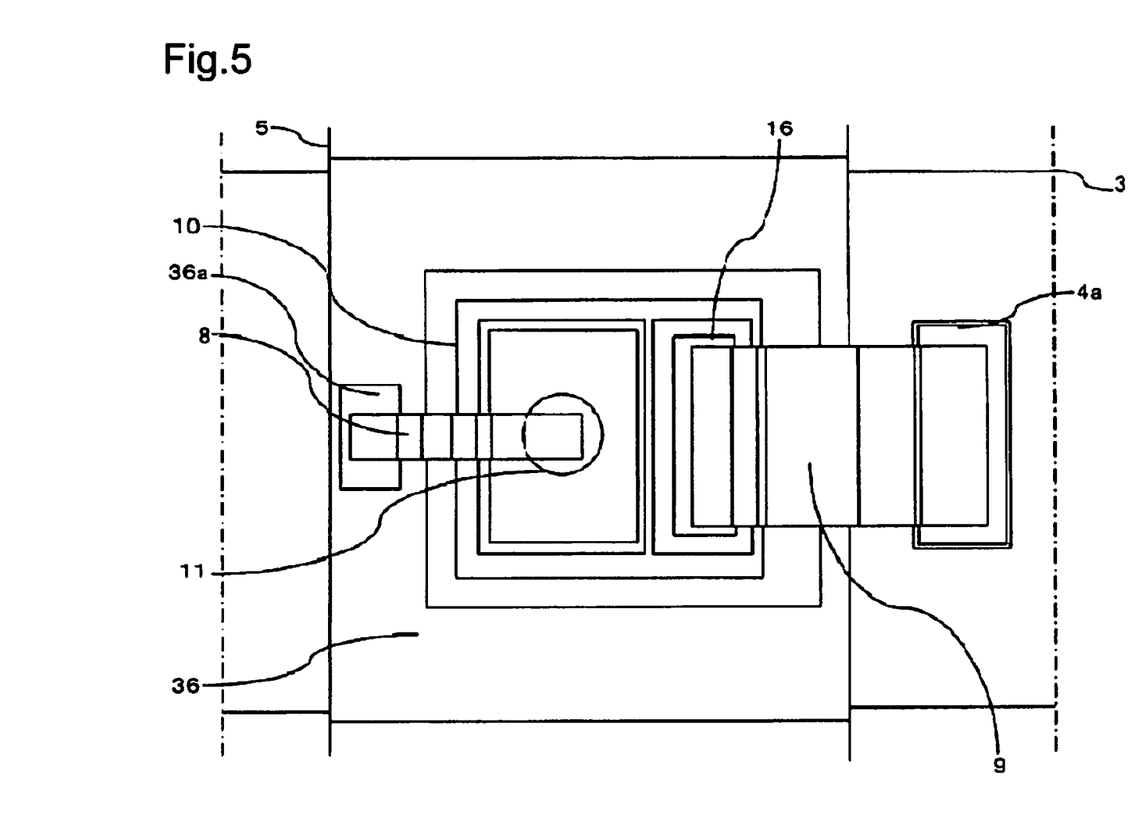
FIG. 5 is a plan view of the surface configuration of the pixel of FIG. 4.
Figure 6:
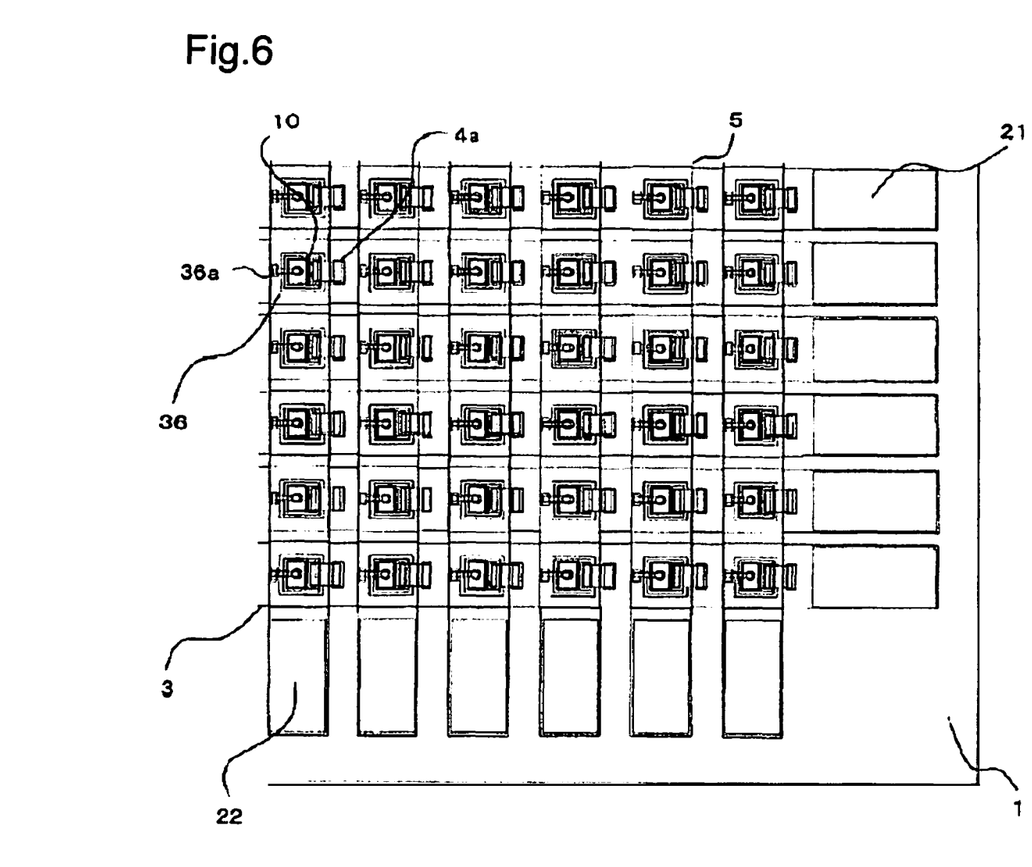
FIG. 6 is a plan view of the entire display apparatus of according to the second embodiment of the invention.

FIG. 4 is a sectional view of a pixel of a display apparatus according to the second embodiment of the invention; FIG. 5 is a plan view of a surface configuration of the display apparatus of FIG. 4; and FIG. 6 is a plan view of the entire display apparatus according to the second embodiment. In FIGS. 4 to 6, the elements that are the same as those in FIGS. 1 to 3 of the first embodiment are designated by the same reference numerals.

In the display apparatus of the second embodiment, light-block (non-transmissive) planarizing insulating film 36 is substituted for transmissive planarizing insulating film 6 of the display apparatus in the first embodiment. Planarizing insulating film 36 is formed on the substantially entire surface which planarizes the surface of upper electrode common lines 5 immediately under planarizing insulating film 36, and semiconductor thin film LED 10 is three-dimensionally joined on planarizing insulating film 36 so that the area other than semiconductor thin film LED 10 (the peripheral area of LED 10) is darkened. This enhances lightness contrast between semiconductor thin film LED 10 and the peripheral area, thereby improving conspicuous of a display screen of the display apparatus.

Specifically, similar to the first embodiment, interlayer insulation film 2 on substrate 1, lower electrode common lines 3 arranged in the row direction, interlayer insulation film 4, and upper electrode common lines 5 arranged column direction are layered in the display apparatus of the second embodiment. Different from the first embodiment, light-block planarizing insulating film 36 is formed on the substantially entire surface including the intersection of lower electrode common lines 3 and upper electrode common lines 5 and semiconductor thin film LED 10 is joined on planarizing insulating film 36 by an intermolecular force. The material of light-block planarizing insulating film 36 can be, for example, novolac permanent resist to which carbon black is added or polyimide resin to which carbon black is added. Light-block planarizing insulating film 36 has contact holes 36a for upper electrode common lines, openings at positions corresponding to contact holes 9a for the lower electrode common lines, openings at positions corresponding to contact pads 21 for lower electrode common lines disposed at the outer portion of the display apparatus, and openings at positions corresponding to contact pads 22 for the upper electrode common lines. Other configurations are the same as those of the first embodiment.

(Manufacture of Second Embodiment)

Similar to the first embodiment, interlayer insulation film 2, lower electrode common lines 3 with contact pads 21 for the lower electrode common lines extending in the row direction, interlayer insulation film 4, upper electrode common lines 5 with contact pads 22 for upper electrode common lines extending in the column direction are layered on substrate 1. Light-block planarizing insulating film 36 is formed on the substantially entire surface including the intersection of lower electrode common lines 3 and upper electrode common lines 5 by a CVD method or the like. After forming planarizing insulating film 36, planarizing insulating film 36 is patterned by a photolithography technology or the like, such that contact holes 36a for upper electrode common lines, contact holes 4a for the lower electrode common lines, openings corresponding to contact pads 21 for lower electrode common lines disposed at the outer portion of the display apparatus, and openings corresponding to contact pads 22 for upper electrode common lines are opened. Previously formed semiconductor thin film LEDs 10 are joined on planarizing insulating film 36 by an intermolecular force.

After that, similar to the first embodiment, interlayer insulation film 7 such as an inorganic insulating film and an organic insulation film is formed on the entire surface including semiconductor thin film LED 10 by a CVD method or the like. Interlayer insulation film 7 is patterned by a photolithography technology or the like so that portions of interlayer insulation film 7 on the above and the side of semiconductor thin film LEDs 10 are left and the other portions are removed. Further, lower interlayer insulation film 4 is patterned so that contact holes 4a for the lower electrode common lines are opened.

A wire material is formed on the entire surface by a vapor deposition method, a sputtering method or the like. The wire material is patterned by a photolithography technology so that upper electrode connection wires 8 and lower electrode connection wires 9 are formed. In this configuration, each upper electrode connection wire 8 electrically connects corresponding upper contact layer 11 and the portion of upper electrode common line 5 exposed through corresponding contact hole 36a for the upper electrode common line. Further, each lower electrode connection wire 9 electrically connects corresponding lower electrode 16 and a portion of lower electrode common line 3 exposed through corresponding contact hole 4a. When an un-illustrated protective film or the like is formed, the process of manufacturing the display apparatus of FIG. 6 is finished.

(Operation of Second Embodiment)

To drive the display apparatus of FIG. 6, drive current is selectively supplied from an external driving circuit (not shown) to contact pads 21 for the lower electrode common line and to contact pads 22 for the upper electrode common line. The drive current supplied to contact pads 21 and 22 flows through corresponding upper electrode connection wire 8 and lower electrode connection wire 9 shown in FIGS. 4 and 5 via corresponding lower electrode common line 3 and upper electrode common line 5. The drive current flowing through upper electrode connection wiring 8 and lower electrode connection wiring 9 is supplied to upper contact layer 11 and lower electrode 16 of corresponding semiconductor thin film LED 10, and active layer 13 of the corresponding semiconductor thin film LED 10 thus emits light. The emitted light is radiated upward via upper cladding layer 12.

According to the second embodiment, light-block planarizing insulating film 36 covers areas other than contact holes 4a for the lower electrode common lines, contact holes 36a for the upper electrode common lines, contact pads 21 for the lower electrode common lines, and contact pads 22 for the upper electrode common lines. That is, light-block planarizing insulating film 36 covers upper electrode common lines 5 and lower electrode common lines 3. Thus, light reflected toward substrate 1 is blocked and darkened substrate 1 itself can be visually recognized. In other words, since the contrast between the lightened area of semiconductor thin film LEDs 10 and non-illuminated area of semiconductor thin film LEDs 10 is enhanced, a high-contrast display apparatus is obtained.

(Effect of Second Embodiment)

According to the second embodiment, it is possible to manufacture a display apparatus that maximizes the area for forming lower electrode common lines 3 and upper electrode common lines 5 while maintaining a high occupancy ratio of the LED light emitting area. Thus, it is possible to manufacture a high-definition, high-intensity and large-screen display apparatus using semiconductor thin film LEDs 10. Further, since substantially the entire area around semiconductor thin film LED 10 is covered by light-block planarizing insulating film 36, a high-contrast display apparatus can be obtained.

(Modification Examples)

The invention is not limited to the first and second embodiments described above and various applications and modifications can be made. The following (a) to (c) are examples of the applications and modifications.

(a) Although column-direction lines 5 are provided above row-direction lines 3 in the first and second embodiment, positions of column-direction lines 5 and row-direction line 3 in the stacking direction may be changed with each other such that row-direction lines 3 are provided above column-direction lines 5 and planarizing insulating film 6 or 36 is formed on above-located row-direction line 3. Modification (a) results in substantially the same effects as those of the first and second embodiments.

(b) The configuration and shape of the display apparatus may be different from those shown in the drawings.

(c) The materials of each element of the display apparatus and the manufacturing method of the display apparatus may be different from those of the first and second embodiments.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

What is claimed is:

1. A display apparatus comprising:
a plurality of first linear electrodes extending on a planer substrate in a first direction;
a plurality of second linear electrodes extending in a second direction orthogonal to the first direction and spaced from the first linear electrodes in a third direction orthogonal to the plane of the substrate;
a plurality of physically separate first insulating films provided on the second linear electrodes at intersections of the first and second linear electrodes;
a plurality of semiconductor thin film light emitting elements each provided on a respective first insulating film, wherein each semiconductor thin film light emitting element includes an upper surface and a lower surface, the upper surface having a first conductive electrode and a second conductive electrode, the first and second conductive electrodes are formed at the upper surface, and the lower surface contacting the respective first insulating film, wherein a center of each semiconductor thin film light emitting element is provided directly above a respective one of the intersections;
a first connection wire electrically connecting the first linear electrodes and the second conductive electrodes; and
a second connection wire electrically connecting the second linear electrodes and the first conductive electrodes.

2. The display apparatus according to claim 1, wherein the first and second linear electrodes are insulated from each other by a second insulating film provided there-between.

3. The display apparatus according to claim 2 wherein, the first connection wire electrically connects the second conductive electrodes and portions of the first linear electrodes that are exposed from the second insulating film; and
the second connection wire electrically connects the first conductive electrodes and portions of the second linear electrodes that are exposed from the respective first insulating film.

4. The display apparatus according to claim 2, wherein the second insulating film is in direct physical contact with both a respective first linear electrode and a respective second linear electrode.

5. The display apparatus according to claim 1 wherein, each first insulating film is comprised of a material that transmits light emitted from the semiconductor thin film light emitting elements.

6. The display apparatus according to claim 1, wherein each respective first insulating film has a width being narrower than a width of a respective second linear electrode.

7. The display apparatus according to claim 6, wherein each light emitting element has a width being narrower than a respective first insulating film.

8. A display apparatus comprising:
a plurality of first linear electrodes extending on a planer substrate in a first direction;
a plurality of second linear electrodes extending in a second direction orthogonal to the first direction and spaced from the first linear electrodes in a third direction orthogonal to the plane of the substrate;
an opaque insulating film provided on substantially the entire upper surface of the substrate including the intersections of the first and second linear electrodes and areas other than the intersections;
a plurality of semiconductor thin film light emitting elements, each one having an upper surface and a lower surface, the upper surface having a first conductive electrode and a second conductive electrode, the first and second conductive electrodes are formed on the upper surface, and the lower surface being connected to the opaque insulating film, wherein a center of each semiconductor thin film light emitting element is provided directly above a respective one of the intersections;
a first connection wire electrically connecting the first linear electrodes the second conductive electrodes; and
a second connection wire electrically connecting the second linear electrodes and the first conductive electrodes.

9. The display apparatus according to claim 8, wherein the first and second linear electrodes are insulated from each other by an interlayer insulation film provided there-between.

10. The display apparatus according to claim 9 wherein, the first connection wire electrically connects the second conductive electrodes and portions of the first linear electrodes that are exposed from the interlayer insulation film; and
the second connection wire electrically connects the first conductive electrodes and portions of the second linear electrodes that are exposed from the opaque insulating film.

11. The display apparatus according to claim 9, wherein the interlayer insulation film is in direct physical contact with both a respective first linear electrode and a respective second linear electrode.

12. The display apparatus according to claim 8, wherein the opaque insulating film is in direct physical contact with the plurality of second linear electrodes.

13. A display apparatus comprising:
a plurality of first linear electrodes extending on a planer substrate in a first direction;
a plurality of second linear electrodes extending in a second direction orthogonal to the first direction and spaced from the first linear electrodes in a third direction orthogonal to the plane of the substrate;
a first insulating film provided on the second linear electrodes at an intersection of the first and second linear electrodes;
a plurality of semiconductor thin film light emitting elements, each one having an upper surface and a lower surface, the upper surface having a first conductive electrode and a second conductive electrode, the first and second conductive electrodes are formed at the upper surface, and the lower surface being in direct physical contact with the top surface of the first insulating film, wherein a center of each semiconductor thin film light emitting element is provided directly above a respective one of the intersections;
a first connection wire electrically connecting the first linear electrodes and the second conductive electrodes; and
a second connection wire electrically connecting the second linear electrodes and the first conductive electrodes.

14. The display apparatus according to claim 13, wherein the first and second linear electrodes are insulated from each other by a second insulating film provided therebetween.

15. The display apparatus according to claim 14 wherein, the first connection wire electrically connects the second conductive electrodes and portions of the first linear electrodes that are exposed from the second insulating film; and
the second connection wire electrically connects the first conductive electrodes and portions of the second linear electrodes that are exposed from the respective first insulating film.

16. The display apparatus according to claim 13 wherein, each first insulating film is comprised of a material that transmits light emitted from the semiconductor thin film light emitting elements.

17. The display apparatus according to claim 13, wherein the first insulating film is in direct physical contact with the plurality of second linear electrodes.

* * * * *